United States Patent
Leitgeb et al.

(10) Patent No.: US 10,051,747 B2
(45) Date of Patent: Aug. 14, 2018

(54) METHOD FOR THE PRODUCTION OF A CIRCUIT BOARD INVOLVING THE REMOVAL OF A SUBREGION THEREOF

(71) Applicant: AT&S Austria Technologie & Systemtechnik Aktiengesellschaft, Leoben (AT)

(72) Inventors: Markus Leitgeb, Trofaiach (AT); Gerald Weidinger, Leoben (AT); Gerhard Schmid, Trofaiach (AT); Ljubomir Mareljic, Shanghai (CN); Volodymyr Karpovych, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 292 days.

(21) Appl. No.: 14/362,873

(22) PCT Filed: Dec. 3, 2012

(86) PCT No.: PCT/AT2012/000302
§ 371 (c)(1),
(2) Date: Jun. 4, 2014

(87) PCT Pub. No.: WO2013/082637
PCT Pub. Date: Jun. 13, 2013

(65) Prior Publication Data
US 2014/0331494 A1     Nov. 13, 2014

(30) Foreign Application Priority Data
Dec. 5, 2011   (AT) .................................. 658/2011

(51) Int. Cl.
*H05K 3/02*       (2006.01)
*H05K 3/46*       (2006.01)
*H05K 3/00*       (2006.01)

(52) U.S. Cl.
CPC ......... *H05K 3/4697* (2013.01); *H05K 3/0044* (2013.01); *H05K 3/4691* (2013.01);
(Continued)

(58) Field of Classification Search
CPC .. H05K 3/0044; H05K 3/4691; H05K 3/4697; H05K 2201/09127;
(Continued)

(56) References Cited

U.S. PATENT DOCUMENTS 5,144,534 A * 9/1992 Kober .................. H05K 3/4691
                                                          29/846
5,201,268 A * 4/1993 Yamamoto ............... B41M 1/10
                                                          101/170

(Continued)

FOREIGN PATENT DOCUMENTS

DE         4003344 C1    6/1991
JP         06252559 A    9/1994
(Continued)

OTHER PUBLICATIONS

International Search Report for International Application No. PCT/AT2012/000302, International Filing Date Dec. 3, 2012, Search Completed Jul. 9, 2013, dated Jul. 19, 2013, 3 pgs.

(Continued)

*Primary Examiner* — Donghai D Nguyen
(74) *Attorney, Agent, or Firm* — KPPB LLP

(57) ABSTRACT

Methods for the production of a circuit board involving the removal of a subregion in accordance with various embodiments of the invention are disclosed. In one embodiment, the production of a circuit board, made of at least two interconnected layers of material, involving the removal of a subregion including a portion of at least one of the at least two interconnected layers from the circuit board includes providing an adhesion preventing material under the subregion (Continued)

to be removed to a layer in the at least two interconnected layers that is adjacent to the at least one layer including the subregion, separating edge regions of the subregion to be removed from adjoining regions of the circuit board, connecting an external surface of the subregion to be removed to an external element, and displacing the external element to separate the subregion to be removed from the adjacent layer of the circuit board.

19 Claims, 3 Drawing Sheets

(52) U.S. Cl.
CPC .............. *H05K 2201/09127* (2013.01); *H05K 2203/0191* (2013.01); *H05K 2203/0264* (2013.01); *Y10T 29/49156* (2015.01)

(58) Field of Classification Search
CPC .... H05K 2203/0264; H05K 2203/0191; Y10T 29/49156; Y10T 29/49126; Y10T 29/49155
USPC ................ 29/830, 846, 847; 174/254; 216/2
See application file for complete search history.

(56) References Cited

U.S. PATENT DOCUMENTS

| | | |
|---|---|---|
| 5,645,673 A | 7/1997 | Fasano et al. |
| 5,827,751 A * | 10/1998 | Nuyen ................ H01L 21/6835 257/E21.097 |
| 7,036,214 B2 * | 5/2006 | Kondo ................ H05K 3/4691 29/830 |
| 8,470,184 B2 * | 6/2013 | Saint-Patrice ...... B81C 1/00047 216/2 |
| 2010/0059262 A1 | 3/2010 | Weidinger et al. |
| 2010/0195967 A1 | 8/2010 | Wang et al. |
| 2014/0373350 A1 | 12/2014 | Leitgeb et al. |

FOREIGN PATENT DOCUMENTS

| | | |
|---|---|---|
| JP | 08148835 A | 6/1996 |
| WO | 2008098269 A1 | 8/2008 |
| WO | 2008098271 A1 | 8/2008 |
| WO | 2013082637 A2 | 6/2013 |

OTHER PUBLICATIONS

International Search Report for International Application No. PCT/AT2012/000303, International Filing Date Dec. 3, 2012, Search Completed Sep. 4, 2013, dated Sep. 17, 2013, 3 pgs.

* cited by examiner

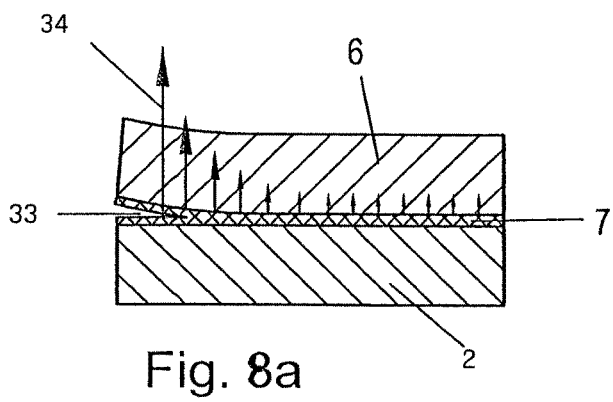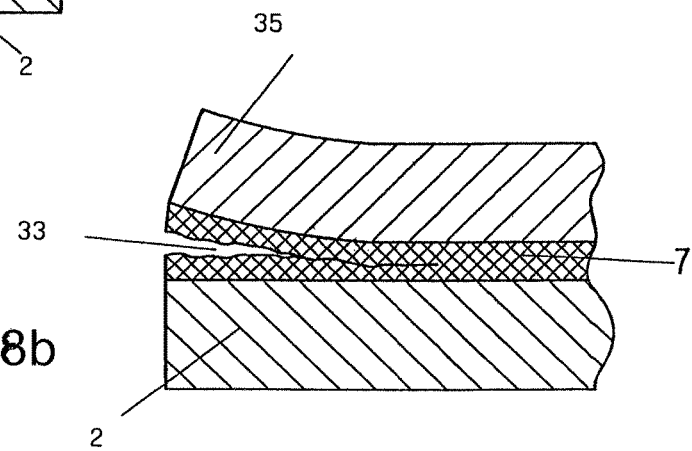
Fig. 8
Fig. 8a
Fig. 8b

METHOD FOR THE PRODUCTION OF A CIRCUIT BOARD INVOLVING THE REMOVAL OF A SUBREGION THEREOF

FIELD OF THE INVENTION

The present invention relates to a method for the production of a circuit board involving the removal of a subregion thereof, wherein at least two layers or plies of the circuit board are interconnected, and the subregion to be removed is prevented from being connected to an adjacent ply of the circuit board by providing or applying an adhesion-preventing material, and edge regions of the subregion to be removed are separated from adjoining regions of the circuit board. The present invention additionally relates to a use of such a method.

BACKGROUND

A method of the type mentioned in the introduction can be inferred for example from WO 2008/098269 A or WO 2008/098271 A, wherein, within the scope of production of a circuit board, it is sought to remove a subregion thereof easily and reliably, for example so as to expose an element or to form a reveal for installation of an element, in particular subsequently. Within the scope of production of a multi-ply circuit board, it is known to interconnect individual layers or plies of such a circuit board by adhesive, press or lamination methods, wherein layers or plies of this type not only have a different structure, but are usually also produced from different materials, and/or further elements, such as active or passive components, are or will be incorporated in such layers or plies. In accordance with this known method, it is sought within the scope of production of a circuit board or a circuit board intermediate product or a circuit board element to remove subregions of such a circuit board or a layer or ply following a process in which a number of layers or plies are connected, in particular so as to be able to insert further components in subsequent method steps, for example.

BRIEF SUMMARY OF THE INVENTION

In accordance with the known method, it is proposed to provide an adhesion-preventing material in the region of the subregion of the circuit board or a layer or ply thereof to be removed subsequently, such that, following a connection of a plurality of plies or layers of the circuit board, edge regions of the subregion to be removed are severed or separated, and, thereafter, in view of the adhesion-preventing material provided between the subregion to be removed and the adjoining or adjacent ply or layer, a removal of this subregion is possible. With this known method the subregion is removed substantially manually, wherein, in particular with use of correspondingly fine tools, it is attempted to lift or raise the sub-region and therefore to remove said subregion in the region of the severed edges. In particular under consideration of the usually small dimensions of circuit boards or circuit board elements and therefore small dimensions of a subregion to be removed and the fine structure of such circuit boards, there is a risk of damage as a result of such a manual lifting of the subregion of a circuit board to be removed, in particular to regions of the circuit board adjoining said subregion. Alternatively, in particular with flexible circuit boards, it is proposed to use bending processes to raise such a subregion to be removed, wherein, however, there is again a risk of damage to the circuit board to be produced.

The object of the invention is therefore to develop a method of the type mentioned in the introduction to the extent that the above-mentioned disadvantages or problems are avoided or largely reduced and in particular a subregion to be removed can be removed easily and reliably, in particular without causing damage to regions of the circuit board to be produced that adjoin said subregion.

To achieve these objects a method of the type mentioned in the introduction is basically characterised in that, once the edge regions have been separated or severed, an external surface of the subregion to be removed is coupled or connected to an external element, and the subregion to be removed is separated from the adjacent ply of the circuit board by a raising or displacement of the external element. Since, in accordance with the invention, an external surface of the subregion to be removed is coupled or connected to an external element, it is thus ensured, in contrast to the known prior art, that damage to regions of the circuit board to be produced that adjoin the subregion to be removed can be reliably prevented when the subregion to be removed is removed or lifted, since in particular there is no mechanical stressing or influencing of the regions of the circuit board that are attached to or adjoin the subregion to be removed. In accordance with the invention it is proposed that, following an appropriate connection or coupling between the external surface of the subregion to be removed and an external element, this subregion to be removed can be reliably and easily separated from the circuit board, in particular from the adjacent ply thereof, by a raising or displacement of the external element, such that not only can such a removal of the subregion to be removed be performed on the whole easily and reliably and also quickly, but in particular damage to regions attached thereto can be avoided.

In conjunction with the present description, it is noted that the expression "circuit board" used herein is to denote not only a substantially finished multi-ply circuit board, but the fact that a removal, provided in accordance with the invention, of a subregion of such a circuit board can also be provided in different intermediate steps of a production process, such that the general term "circuit board" is also to be understood to mean circuit board elements or circuit board intermediate products during different method steps within the scope of production, in particular multi-step production, of a circuit board.

In accordance with a preferred embodiment it is proposed for a crack formation and/or a detachment from the subregion of the circuit board to be removed to be induced in an edge region or subregion in or on the layer made of the adhesion-preventing or bonding-preventing material and for the subregion to be removed to then be removed. The subregion to be removed is thus then removed easily and reliably, since any remaining minor adhesion or attachment between the subregion to be removed and the adjoining or adjacent layer or ply of the circuit board, at least in a subregion, is overcome as a result of the induced crack formation or detachment in an edge region or subregion, and the subregion to be removed can thus be lifted or removed easily and substantially automatically.

A particularly easy and reliable assisting of the removal of the subregion to be removed is attained in accordance with a further preferred embodiment of the method according to the invention in that the crack formation and/or detachment from the subregion of the circuit board to be removed in or on the layer made of the adhesion-preventing material is/are produced by an introduction or forming of twists of the subregion to be removed, said twists being produced as a result of a non-uniform stressing of said subregion to be removed. A non-uniform stressing of this type of the subregion to be removed can be introduced into the subregion to be removed without causing damage to the circuit board to be produced, such that a lifting or detachment and removal of the subregion to be removed is assisted and/or simplified.

In accordance with a further preferred embodiment of the method according to the invention it is proposed for the external element and the external surface of the subregion to be removed to be coupled or connected by an adhesion, welding, soldering, bonding, friction welding or the like. Such an external element is thus easily and reliably coupled or connected to the external surface of the subregion to be removed, wherein the specified method steps can be integrated in a simple manner within the scope of a method for producing a circuit board.

For further simplification and acceleration of a removal of such a subregion of a circuit board to be removed and therefore for acceleration of the production method of such a circuit board, it is proposed in accordance with a further preferred embodiment for the external element to be coupled or connected in an automated manner to the external surface of the subregion to be removed.

In addition, for further acceleration of the production method, in particular in conjunction with the removal of the subregion to be removed, it is proposed to remove the subregion to be removed in an automated manner, as corresponds to a further preferred embodiment of the method according to the invention.

To sever easily and reliably the edge regions of the subregion to be removed, it is proposed in accordance with a further preferred embodiment for the edge regions of the subregion to be removed to be defined and/or separated or severed in a manner known per se by a milling, carving or cutting, in particular laser cutting.

For easy removal of the subregion to be removed, it is proposed in accordance with a further preferred embodiment for the adhesion-preventing material to be formed in a manner known per se by a waxy paste, which, during a process in which at least two layers or plies of the circuit board are connected, prevents an adhesion between the subregion to be removed subsequently and the adjacent ply of the circuit board. Following a connection or coupling between the external element and the outer or external surface of the sub-region to be removed, said subregion can be removed in this was in particular with a low application of force.

For further simplification and acceleration of the method according to the invention in conjunction with the removal of the subregion to be removed and an automation thereof, it is proposed in accordance with a further preferred embodiment for the coupling or connection between the external surface of the subregion to be removed and the external element to be regulated or controlled by a monitoring arrangement, which determines the position of the subregion to be removed, in particular in an automated manner by means of an image processing method.

Within the scope of the production of circuit boards it is known to optionally arrange a larger number of circuit boards to be produced, in particular identically, in a common frame or support element and to perform a plurality of machining or processing steps in particular substantially simultaneously on the plurality of circuit boards or circuit board elements. In this regard, it is proposed in accordance with a further preferred embodiment of the method according to the invention to remove substantially simultaneously a plurality of subregions to be removed, in particular from a plurality of circuit boards, with use of a common external element, such that a further simplification or acceleration can be attained when a plurality of subregions to be removed are removed from a corresponding plurality of circuit boards. Alternatively and/or additionally it is possible in accordance with the invention to use a common external element to remove from a circuit board a plurality of subregions to be removed.

For a simple and reliable coupling of such a plurality of subregions to be removed, it is proposed in accordance with a further preferred embodiment for the common external element to be coupled by an adhesive connection to each of the subregions to be removed, wherein the adhesive in particular is applied to the subregions to be removed in each case in accordance with the dimensions thereof.

To provide a sufficient adhering connection or force between the external surface of the subregion to be removed and the external element, it is additionally proposed for the adhesive to be subjected to a curing process for a connection between the external surface of the subregion to be removed and the external element, as corresponds to a further preferred embodiment of the method according to the invention.

For the simultaneous removal of a plurality of subregions to be removed from a corresponding plurality of circuit boards or circuit board elements, which in particular are arranged in a common frame or support element, it is additionally proposed for the common element to be formed by a flat material layer, in particular a film.

In accordance with an alternative embodiment of the method according to the invention it is proposed for the external element to be formed by a wire or at least one pin-like or rod-like element, in particular made of plastic, which is coupled or connected by means of soldering, welding, friction welding, bonding or adhesion to the external surface of the subregion to be removed. A use of a wire or rod-like element or plastic pin as an external element provides a simple and correspondingly easily available external element. In addition, it is possible to perform the coupling or connection, provided in accordance with the invention, between the external element, formed by a wire or at least one rod-like element, and the external surface of the subregion to be removed using method steps that are considered to be known per se in particular within the scope of the production or machining or processing of a circuit board, and that can therefore be integrated easily into a method according to the invention for producing such a circuit board.

For a reliable positioning and subsequent removal of the subregion to be removed, it is additionally proposed for the external element to be positioned by means of an automated handling device on the external surface of the subregion to be removed, and, following a connection or coupling to the external surface, for an automated removal of the subregion to be removed to be performed, as corresponds to a further preferred embodiment of the method according to the invention.

As already stated above, it is additionally proposed in accordance with the invention for the method according to the invention or a preferred embodiment thereof to be implemented or used for the production of a multi-ply circuit board or a multi-ply circuit board element or circuit board intermediate product.

In particular in conjunction with such a use according to the invention, it is additionally proposed for the method according to the invention to be used to produce voids, in particular three-dimensional voids or cavities in a circuit board.

Further preferred possible uses of the method according to the invention lie in the production of at least one channel in a circuit board, a revealing of at least one element, in particular a registration element inside, or in inner plies of a multi-ply circuit board, a production of recessed and/or stepped subregions of a circuit board and/or a production of a rigid/flexible circuit board.

BRIEF DESCRIPTION OF THE DRAWINGS

The invention will be explained in greater detail hereinafter on the basis of exemplary embodiments of the method according to the invention illustrated schematically in the accompanying drawing, in which:

FIG. 8, in accordance with the method according to the invention and in a simplified illustration, schematically shows the inducing of a crack formation in the adhesion-preventing or bonding-preventing layer in a subregion below the subregion to be removed, wherein the introduction of a non-uniform stressing for crack formation is indicated schematically in FIG. 8a, whereas a crack formation caused by a twisting of the subregion to be removed is indicated in FIG. 8b.

DETAILED DESCRIPTION OF THE INVENTION

Figure 1:
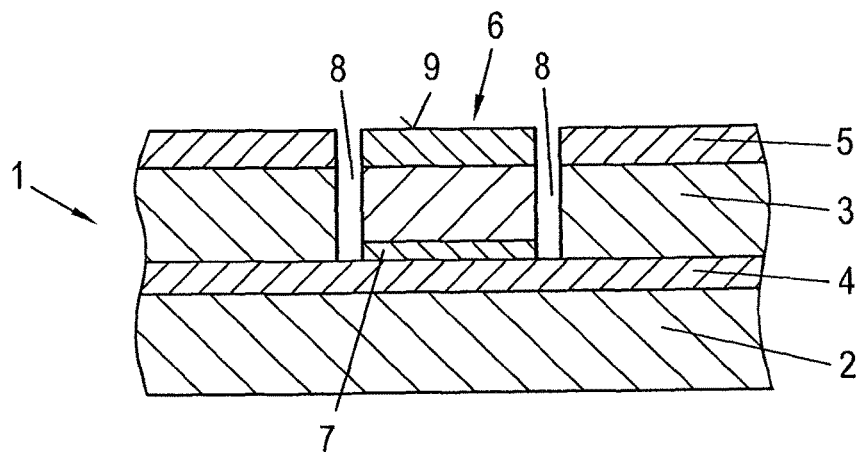
FIG. 1 shows a schematic section through a subregion of a circuit board, wherein, when carrying out the method according to the invention, edge regions of a subregion to be removed have already been severed.

In the method step illustrated in FIG. 1, a circuit board or a subregion thereof is denoted by 1, wherein it can be seen that the circuit board 1 is formed by a plurality of layers or plies, wherein, for example, layers 2 and 3 each consist of an insulating material, for example FR4, whereas intermediate plies 4 and 5 consist of a conducting or conductive material, in particular copper, and are optionally structured.

It is also noted that the circuit board 1 illustrated generally in FIG. 1 may represent not only a substantially finished circuit board, but also potentially a circuit board element or circuit board intermediate product, which in particular is subjected to further machining or processing steps. In addition, generally known method steps for the production of such a multi-ply circuit board and, by way of example, for structuring the conducting layers or plies 4 or 5 will not be discussed in greater detail, since these are considered to be known per se.

In FIG. 1 it is additionally shown that a subregion of the circuit board 1, said subregion being denoted generally by 6 and being intended for subsequent removal, is attached by means of a layer 7 made of an adhesion-preventing material to the adjoining or adjacent layer or ply 4 during the process (not described in greater detail) for producing the multi-ply circuit board 1, such that, following a severing of the edge regions of the subregion 6 to be removed, said severing having been performed already in the illustration of FIG. 1 as indicated by the separated or severed regions 8, the subregion 6 to be removed can be easily separated from the adjoining or adjacent layer or ply 4.

Figure 2:
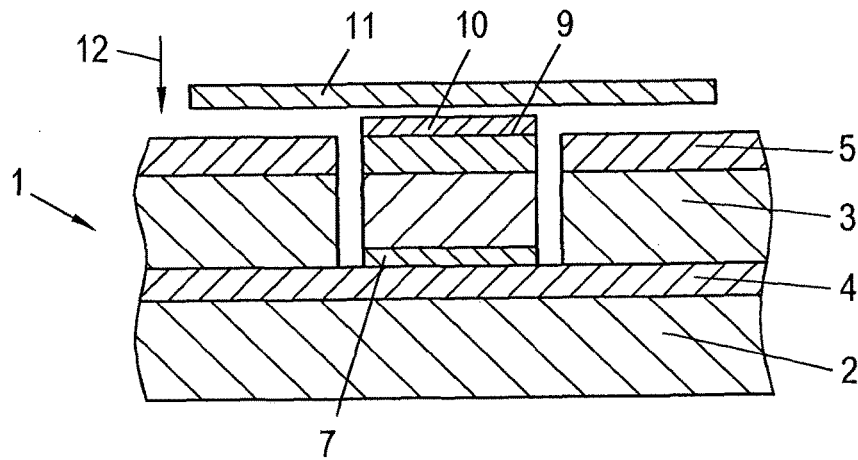
FIG. 2 shows a further method step of the method according to the invention subsequent to FIG. 1, wherein a connection or coupling between the external surface of the subregion to be removed and an external element is prepared or established.

In order to avoid in particular mechanical damage to regions of the circuit board 1 that adjoin the subregion 6 to be removed, an adhesive 10 is applied to an external surface 9 of the subregion to be removed, as illustrated in FIG. 2, wherein the external surface 9, on which the adhesive 10 is provided, is subsequently connected or coupled to a film 11, as is indicated by the arrow 12 in FIG. 2. The film 11 here constitutes an external element, which is coupled by means of the adhesive 10 to the subregion to be removed, and in particular to the external surface 9 thereof. For a proper and/or reliable adhesion of the external element formed by the film 11, a curing process of the adhesive 10 can be performed, for example.

Figure 3:
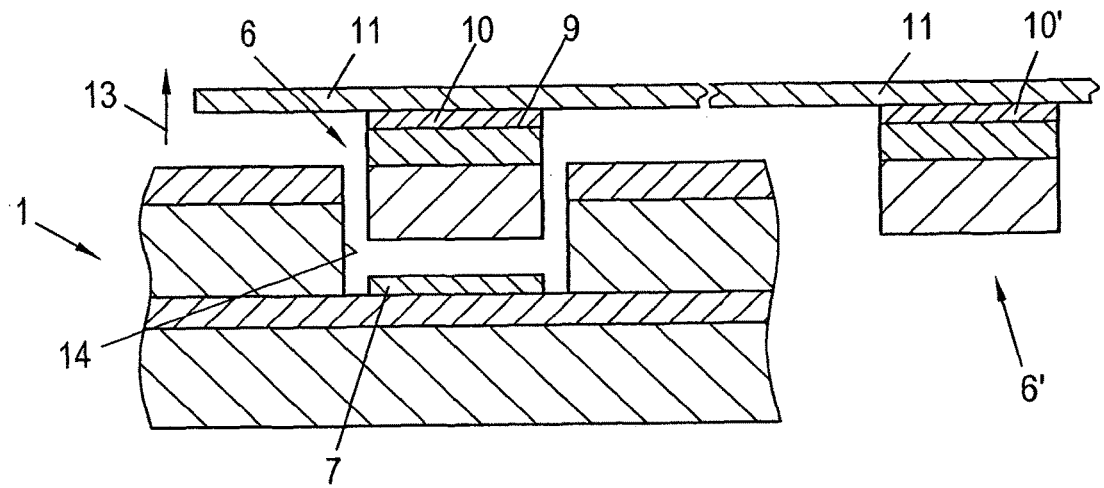
FIG. 3 shows a schematic illustration of a further method step, wherein the subregion to be removed is removed following a connection or coupling to the external element.

Following such a coupling or connection between the subregion 6 to be removed, and in particular the external surface 9 thereof, and the external element formed by a film 11, the subregion 6 to be removed is removed or lifted easily and reliably by lifting or displacing the external element formed by the film 11 in the direction of the arrow 13, as is visible in FIG. 3, whereby a void 14 or recessed or revealed region is produced in the circuit board 1. The subregion 6 to be removed can be easily lifted or removed by provision of the adhesion-preventing material 7, such that any mechanical stresses or damage to regions of the circuit board or of the circuit board element 1 that adjoin the subregion 6 to be removed can be reliably avoided.

In FIG. 3 it is additionally schematically indicated that a plurality of such circuit boards or circuit board elements are arranged side by side, for example in a frame or support element (not illustrated in greater detail), such that, by providing an external element 11 having correspondingly large dimensions, a corresponding plurality of subregions to be removed can be removed simultaneously, wherein such an additional subregion to be removed is indicated schematically in FIG. 3 by 6'. This subregion to be removed is likewise connected or coupled via a layer of adhesive 10' to the external element 11 formed by a film.

For example, a plurality of subregions to be removed can thus be removed easily from a corresponding plurality of circuit boards or circuit board elements 1 arranged for example in a common frame or support element. Similarly, a plurality of subregions 6 to be removed can be removed from a circuit board 1 by a common external element 11.

The adhesive 10 for a coupling or connection between the external surface 9 of the subregion 6 to be removed and the external element 11 is applied substantially merely in accordance with the dimensions of the external surface 9 of the subregion 6 to be removed, such that an adhesion of the external element 11 to further regions of the circuit board 1 that adjoin the subregion 6 to be removed is avoided or a subsequent cleaning likewise can be omitted.

A one-component adhesive that cures under heat and that, by means of a printing or metering method, for example screen printing, is applied to, in particular imprinted onto, the external surface 9 of the subregion 6 to be removed can be used as adhesive by way of example. For example, a rigid cover film for removing the subregion 6 to be removed or optionally a plurality thereof can be used as an external element 11.

Instead of an application of an adhesive and a subsequent connection or coupling to an external element formed by a film 11, an adhesive tape can also be used for example, wherein, by peeling off the adhesive tape and due to the low adhesion between the subregion 6 to be removed and the underlying or adjacent layer 4 as a result of the provision of the adhesion-preventing material 7, the subregion 6 to be removed can likewise be lifted or removed reliably and easily, without having to fear mechanical influences or damage to the adjoining regions of the circuit board 1.

Figure 4:
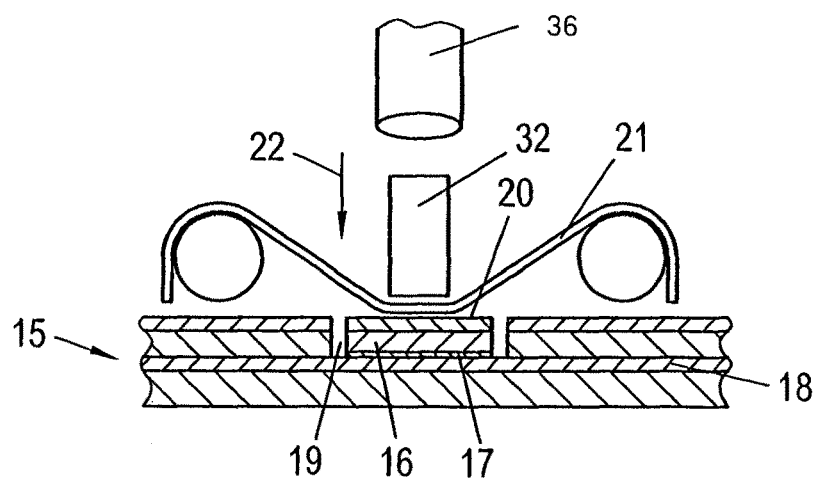
FIG. 4, in an illustration similar to FIG. 2, shows a method step of a modified method, wherein an external element is formed by a wire to be connected to the external surface of a subregion to be removed.
Figure 5:
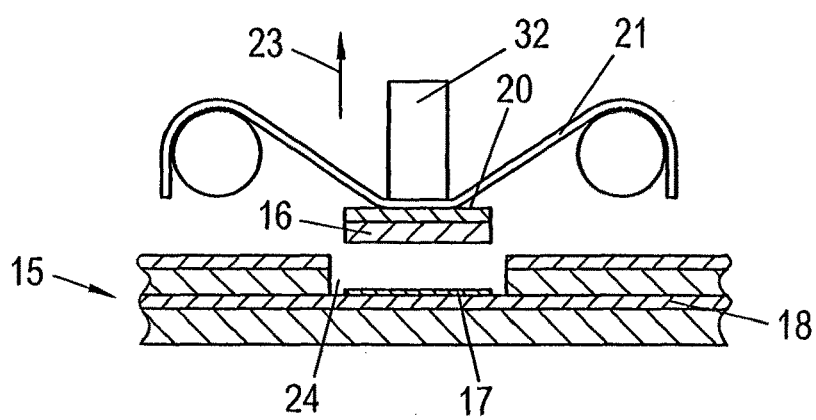
FIG. 5, in an illustration similar to FIG. 3, shows the removal of the subregion to be removed.

A modified embodiment of a method for removing a subregion of a circuit board is illustrated in FIGS. 4 and 5. It can be seen in FIG. 4 that, again, a multi-ply circuit board indicated schematically by 15 has been produced in prior method steps not illustrated in greater detail, wherein a subregion 16 to be removed is again attached by means of an adhesion-preventing layer 17 to an underlying layer or ply 18. Similarly to the illustration according to FIG. 1, edge regions of the subregion 16 to be removed are removed or severed, as indicated by 19.

For a coupling to the external surface 20 of the subregion 16 to be removed, a wire 21 is provided as an external element and is connected by a plunger-like device 32 in the direction of the arrow 22 to the external surface 20 of the subregion 16 to be removed, wherein a soldering, welding or bonding can be used for this purpose, for example.

Following a coupling between the external element formed by the wire 21 and the external surface 20 of the subregion 16 to be removed, this subregion is removed by raising the wire 21 in the direction of the arrow 23, such that, as with the previous embodiment, a void 24 can be provided in the circuit board or the circuit board element 15 following the removal of the subregion 16 to be removed.

For a substantially automated positioning of the external element 21 on the subregion 16 to be removed, a monitoring arrangement is indicated schematically in FIG. 4 by 36, which for example contains a camera inter alia. By means of an image processing method known per se, the position of the subregion 16 to be removed can be determined substantially in an automated manner, and a positioning and fixing of the external element 21 formed by a wire on the external surface 20 of the subregion 16 to be removed can be performed likewise in an automated manner.

A subregion 16 to be removed can thus be removed easily and reliably in a substantially automated method for production of a multi-ply circuit board, for example so as to provide a three-dimensional void 24 or a channel in such a circuit board 15.

Alternatively, such a removal of the sub-region 16 to be removed can be provided for example so as to provide an element integrated in the multi-ply circuit board 15.

Figure 6:
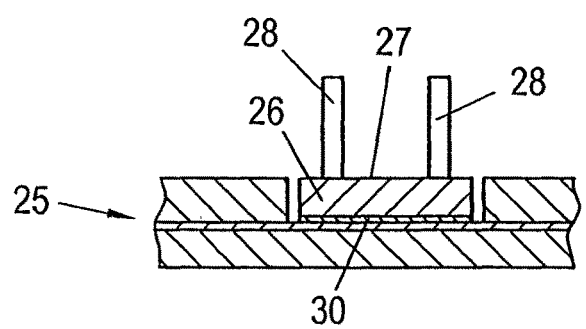
FIG. 6, in an illustration similar to FIG. 4, shows a connection or coupling between the external surface of a subregion to be removed and an external element.
Figure 7:
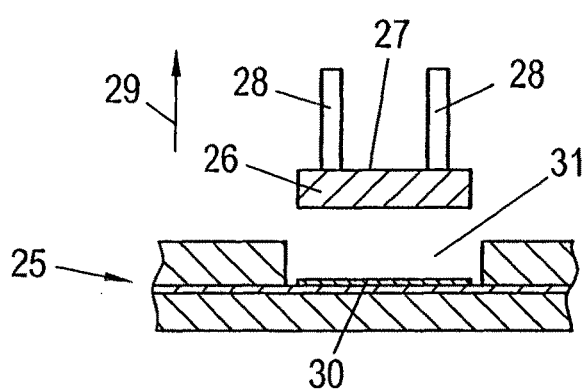
FIG. 7, in an illustration similar to FIG. 5, shows a removal of the subregion to be removed.

A further modified embodiment of a method for removing a subregion from a circuit board 25 is illustrated in FIGS. 6 and 7, wherein, for example, similarly to the illustration according to FIG. 4, in the method step illustrated in FIG. 6 a subregion 26 to be removed is coupled on its external surface 27 to rod-like or bar-like elements 28, which for example are in turn coupled within the scope of an automated monitoring method to the external surface 27 of the subregion 26 to be removed, similarly to the embodiment according to FIG. 4. Such a coupling can be performed for example by an adhesion, welding, soldering or bonding. Alternatively, a friction welding of a plastic element 28, which for example is formed from polyethylene or polypropylene, can be provided for a connection to the external surface 27 of the subregion 26 to be removed.

Following the coupling to the external surface 27 of the subregion 26 to be removed, the subregion to be removed is removed in accordance with the arrow 29 by a raising or displacement of the external elements 28, similarly to the previous embodiments, so as to form or provide a void or a reveal 31, wherein an adhesion-preventing layer or ply is denoted by 30 in this embodiment.

In FIG. 8, in which the reference signs of FIG. 1 have been retained for simplification and an optionally multi-ply structure is not illustrated in detail, a crack formation is induced in the adhesion-preventing or bonding-preventing material 7, as is indicated in FIGS. 8a and 8b by 33. A crack formation 33 of this type, as a result of which the subregion 6 to be removed can then be removed easily from the layer 2 of the circuit board to be produced, can be formed for example by introducing different stresses to the subregion 6 to be removed, as is shown schematically in FIG. 3a by the arrows 34 indicating different stresses, wherein such an introduction of different stresses can be implemented for example by a different introduction of force, in particular in an edge region in the case of a removal with use of a wire according to FIG. 5 or with use of rod-like elements 28 according to FIG. 7.

Alternatively or additionally, as is indicated in FIG. 8b, a crack formation 33 can be induced by a twisting of an edge region 35 of the sub-region 6 to be removed, whereby the subregion 6 to be removed can then likewise be removed easily from the circuit board or the underlying or adjoining layer or ply 2.

Instead of the illustrated voids 14 or 24 or 31, which have substantially linear external delimitations, a recessed and/or stepped subregion can also be produced, for example by a multi-ply removal of a number of subregions to be removed in layers or plies of a multi-ply circuit board that are arranged one above the other.

The invention claimed is:

1. A method for the production of a circuit board made of at least two interconnected layers of material involving the removal of a subregion of the circuit board including a portion of at least one of the at least two interconnected layers from the circuit board, wherein at least one of the interconnected layers is an insulation layer comprising FR4 material, the method comprising: providing an adhesion-preventing material under the subregion of the circuit board to be removed to a layer in the at least two interconnected layers that is adjacent to the at least one layer including the subregion of the circuit board; separating edge regions of the subregion of the circuit board to be removed from adjoining regions of the circuit board; applying an adhesion layer only to the subregion of the circuit board to be removed; connecting the adhesion layer of an external surface of the subregion of the circuit board to be removed to an external element; and displacing the external element to separate the subregion of the circuit board to be removed from the adjacent layer of the circuit board, wherein the edge regions are separated from the adjoining regions in a manner selected from the group consisting of milling, carving, cutting, and laser cutting.

2. The method according to claim 1, further comprising inducing a crack formation in a portion of the subregion of the circuit board made of the adhesion-preventing material.

3. The method according to claim 2, wherein the inducing of the crack formation in the subregion of the circuit board to be removed is produced by forming of twists of the subregion of the circuit board to be removed, where the twists are produced as a result of a non-uniform stressing of said subregion of the circuit board to be removed.

4. The method according to claim 1, wherein the external element is connected in an automated manner to the external surface of the subregion of the circuit board to be removed.

5. The method according to claim 1, wherein the subregion of the circuit board to be removed is removed in an automated manner.

6. The method according to claim 1, where the adhesion-preventing material is formed by a waxy paste, which, during a process of connecting at least two layers of the circuit board, prevents an adhesion between the subregion of the circuit board to be removed subsequently and the adjacent layer of the circuit board.

7. The method according to claim 1, characterized in that the connection between the external surface of the subregion of the circuit board to be removed and the external element is controlled by a monitoring arrangement, which determines the position of the subregion of the circuit board to be removed in an automated manner by means of an image processing method.

8. The method according to claim 1, further comprising removing a plurality of subregions of a plurality of circuit boards from the plurality of circuit boards substantially simultaneously using a common external element.

9. The method according to claim 8, where the common external element is coupled by an adhesive connection to each of the plurality of subregions of the plurality of circuit boards to be removed, wherein the adhesive connection is applied to each of the plurality of subregions of the plurality of circuit boards to be removed in accordance with the dimensions of each of the plurality of subregions of the plurality of circuit boards.

10. The method according to claim 9, characterized in that the adhesive is subjected to a curing process for a connection between the external surface of the subregion of the circuit board to be removed and the external element.

11. The method according to claim 8, where the common element is formed by a flat material layer.

12. The method according to claim 1, where the external element is formed by a wire connected to the adhesion layer of the external surface of the subregion of the circuit board to be removed.

13. The method according to claim 12, further comprising positioning the external element by means of using an automated handling device on the external surface of the subregion of the circuit board to be removed, and, following a connection to the external surface, performing an automated removal of the subregion of the circuit board to be removed.

14. The method according to claim 1, where the circuit board is made of at least three interconnected layers of material.

15. The method according to claim 14, wherein displacing the external element to separate the subregion of the circuit board creates a three-dimensional void or cavity in the circuit board.

16. The method according to claim 14, wherein displacing the external element to separate the subregion of the circuit board creates at least one channel in the circuit board.

17. The method according to claim 14, wherein displacing the external element to separate the subregion of the circuit board reveals at least one registration element in the interior or in inner plies of the circuit board.

18. The method according to claim 14, wherein displacing the external element to separate the subregion of the circuit board creates recessed or stepped subregions of the circuit board.

19. The method according to claim 14, wherein the circuit board is rigid/flexible.

* * * * *